US010778929B2

(12) United States Patent
Kim et al.

(10) Patent No.: US 10,778,929 B2
(45) Date of Patent: Sep. 15, 2020

(54) VOLUME ADJUSTING DEVICE AND ADJUSTING METHOD THEREOF

(71) Applicant: LG ELECTRONICS INC., Seoul (KR)

(72) Inventors: Young Man Kim, Seoul (KR); Sang Jun Oh, Seoul (KR); Kyu Ho Lee, Seoul (KR); Jae Woong Jeong, Seongnam-si (KR); Seung Hyun Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/561,779

(22) Filed: Sep. 5, 2019

(65) Prior Publication Data

US 2019/0394420 A1 Dec. 26, 2019

(30) Foreign Application Priority Data

Jul. 30, 2019 (KR) ........................ 10-2019-0092579

(51) Int. Cl.
*H04N 5/445* (2011.01)
*G10L 21/0232* (2013.01)
*G06N 3/08* (2006.01)
*G06K 9/00* (2006.01)
*G06N 20/00* (2019.01)

(52) U.S. Cl.
CPC ..... *H04N 5/44513* (2013.01); *G06K 9/00228* (2013.01); *G06K 9/00288* (2013.01); *G06N 3/08* (2013.01); *G06N 20/00* (2019.01); *G10L 21/0232* (2013.01); *H04N 2005/44517* (2013.01)

(58) Field of Classification Search
None
See application file for complete search history.

(56) References Cited

U.S. PATENT DOCUMENTS

| 2015/0058877 A1* | 2/2015 | Lakkundi | H04N 21/439 725/19 |
| 2016/0198229 A1* | 7/2016 | Keipert | H04N 21/47217 725/12 |
| 2017/0064244 A1* | 3/2017 | Abou Mahmoud | G11B 27/005 |

FOREIGN PATENT DOCUMENTS

| KR | 10-2007-0119410 A | 12/2007 |
| KR | 10-1695840 B1 | 1/2017 |

* cited by examiner

*Primary Examiner* — Samira Monshi
(74) *Attorney, Agent, or Firm* — Birch, Stewart, Kolasch & Birch, LLP

(57) ABSTRACT

Disclosed are a volume adjusting device and an adjusting method thereof for enabling an electronic device such as a TV to perform a volume adjustment operation among operations executable by the electronic device according to a prediction model stored through machine learning based on communication with surrounding devices in a 5G communication environment. According to the present disclosure, when information indicating adjustment of the volume of an electronic device by a user is generated, volume adjustment information may be learned, and the volume may be automatically adjusted to a volume preferred by the user on the basis of the learned information when the user views a video on the electronic device.

12 Claims, 7 Drawing Sheets

(a)

(b)

(a)

(b)

VOLUME ADJUSTING DEVICE AND ADJUSTING METHOD THEREOF

CROSS-REFERENCE TO RELATED APPLICATION

This present application claims benefit of priority to Korean Patent Application No. 10-2019-0092579, entitled "VOLUME ADJUSTING DEVICE AND ADJUSTING METHOD THEREOF" filed on Jul. 30, 2019, in the Korean Intellectual Property Office, the entire disclosure of which is incorporated herein by reference.

BACKGROUND

1. Technical Field

The present disclosure relates to a volume adjusting device and an adjusting method thereof, and more particularly, to a volume adjusting device and an adjusting method thereof for improving convenience of a user who uses an electronic device by estimating a volume of the electronic device preferred by the user and generating an image at the estimated volume of the electronic device.

2. Description of Related Art

The following descriptions are only for providing background information related to embodiments of the present disclosure, and the descriptions do not necessarily constitute the prior art.

In order to control the operation of electronic devices installed in a home, a user may directly operate the electronic devices or may remotely control the electronic devices using a remote controller or the like.

In particular, there is a known technology in which a TV installed in a home estimates noise included in a sound collected by a remote controller or a microphone installed in the TV, and adjusts the volume of the TV according to the estimated noise.

That is, when receiving a TV image, noise around the TV is measured, and the volume level of the TV is adjusted on the basis of the measured noise. According to this automatic volume adjusting technology, the TV volume is adjusted according to noise around the TV regardless of the type of TV image content, and thus a user's preference that varies according to image content cannot be reflected.

Therefore, it is required to develop a technology for adjusting a TV volume according to the type of content (e.g., music, broadcast, news, etc.) televised through a TV when receiving a TV image, and for learning a TV volume selected by a viewer of TV content so as to televise the content at a learned TV volume when the viewer reselects the TV content that was selected by the viewer.

As a specific example of a technology for adjusting a TV volume, Korean Patent Application Laid-open Publication No. 10-2007-0119410, entitled "TV FOR CONTROLLING VOLUME AUTOMATICALLY AND THE METHOD THEREOF", indicates that a broadcast signal strength is recorded, and the average value of broadcast signal strengths during a certain period of time are recorded so as to decrease a TV broadcast volume when the broadcast signal strength is larger than the average value by a certain value.

The above "TV FOR CONTROLLING VOLUME AUTOMATICALLY AND THE METHOD THEREOF" discloses a technology for reducing auditory discomfort of a user by automatically decreasing an increased volume of an advertisement broadcast in the middle of a TV program. However, the above document does not specifically disclose a technology for adjusting a TV volume according to the type of content (e.g., music, broadcast, news, etc.) televised through a TV, and for learning a TV volume selected by a viewer of TV content so as to televise the content at a learned TV volume when the viewer reselects the TV content that was selected by the viewer.

Korean Patent Registration No. 10-1695840, entitled "SYSTEM FOR AUTOMATIC CONTROLLING DIGITAL TV VOLUME BASED ON LOUDNESS AND THE METHOD THEREOF", proposes a technology for automatically controlling a TV volume by accurately measuring, through a multi-channel microphone, noise and reverberations generated in a broadcast viewing space.

According to the above "SYSTEM FOR AUTOMATIC CONTROLLING DIGITAL TV VOLUME BASED ON LOUDNESS AND THE METHOD THEREOF", the volume of a digital TV is automatically controlled for each sound channel in consideration of all of space information about a viewing environment and noise and reverberations generated in various viewing environments for viewing the digital TV, so as to provide a comfortable viewing environment to a user who is viewing the digital TV.

The above "SYSTEM FOR AUTOMATIC CONTROLLING DIGITAL TV VOLUME BASED ON LOUDNESS AND THE METHOD THEREOF" proposes a technology for adjusting a TV volume according to surrounding noise, but does not specifically disclose a technology for adjusting a TV volume according to the type of content (e.g., music, broadcast, news, etc.) televised through a TV, and for learning a TV volume selected by a viewer of TV content so as to televise the content at a learned TV volume when the viewer reselects the TV content that was selected by the viewer.

Therefore, it is required to develop a technology for learning a TV volume selected by a viewer of TV content and televising the content at a learned TV volume when the viewer reselects the TV content that was selected by the viewer, thereby automatically adjusting a TV volume according to the type of content (e.g., music, broadcast, news, etc.) televised through a TV.

The above-described background art is technical information retained by the inventor to derive the present invention or acquired by the inventor while deriving the present invention, and thus should not be construed as publicly known art that was known prior to the filing date of the present invention.

SUMMARY OF THE INVENTION

An aspect of the present disclosure is to automatically adjusting the volume of an electronic device according to a video displayed on the electronic device such as a TV.

Another aspect of the present disclosure is to learning information about the volume of an electronic device set by a viewer viewing a video, and setting the volume of the electronic device on the basis of the learned information about the electronic device according to the type (content) of a video generated through the electronic device.

In detail, the volume of the electronic device preferred by a user of the electronic device is estimated, and a video is played back at an estimated volume of the electronic device, so as to improve convenience of the user of the electronic device.

Another aspect of the present disclosure is to provide a comfortable viewing environment to an electronic device user who views a video by automatically adjusting the volume of an electronic device such as a TV.

An aspect of the present disclosure is not limited to the above-mentioned aspects, and other aspects and advantages of the present disclosure, which are not mentioned, will be understood through the following description, and will become apparent from the embodiments of the present disclosure. Furthermore, it will be understood that aspects and advantages of the present disclosure can be achieved by the means set forth in the claims and combinations thereof.

A volume adjusting device according to an embodiment of the present disclosure relates to a technology for providing a comfortable viewing environment to an electronic device user who views a video by automatically adjusting the volume of an electronic device such as a TV.

In detail, the volume adjusting device according to an embodiment of the present disclosure may include a reception unit, which receives volume information about an electronic device adjusted by a user, a learning unit, which learns a correlation between the volume information about the electronic device and video content displayed through the electronic device, a memory, which stores a prediction model of an operation executable by the electronic device according to a type of the video content displayed on the electronic device on the basis of the learned correlation between the volume information about the electronic device and the video content, and a device control unit, which controls the electronic device so that the predicted operation executable by the electronic device is executed by the electronic device when the video content displayed through the electronic device is detected.

By using this volume adjusting device, the volume of video content may be automatically adjusted to a volume preferred by a user.

The reception unit according to an embodiment of the present disclosure may include a noise reception unit, which receives noise generated around the electronic device, a volume information reception unit, which receives volume adjustment information about the electronic device when change information about the video content displayed on the electronic device is generated, and a facial information reception unit, which detects facial information about the user adjusting a volume of the electronic device.

That is, the noise generated around the electronic device, the volume information adjusted when content is changed, and the volume information about the electronic device preferred by each user who adjusts the volume may be received.

The noise reception unit according to an embodiment of the present disclosure may receive the noise from a point of time at which the electronic is turned on, or receive the noise when a variation in the volume of the electronic device is at least a preset threshold value.

In detail, when the surrounding noise is larger than the volume of a video while the video is being displayed, the volume of the video may be adjusted higher. As described above, information about noise for which volume adjustment is required may be learned, and the volume may be automatically changed to display a video without being adjusted by a user when noise which matches learned noise occurs.

The facial information reception unit of the volume adjusting device according to an embodiment of the present disclosure may receive facial information about the user when the electronic device is turned on or when a volume adjustment operation of the electronic device is performed.

In detail, the volume of the electronic device may be adjusted when the electronic device is operated. Therefore, the facial information about the user who adjusts the volume of the electronic device when the electronic device is operated may be received, and the received facial information about the user may be used as learned information. Thereafter, when a user operating the electronic device matches a learned user on the basis of the learned facial information, a video may be displayed at a volume preferred by the learned user.

The learning unit of the volume adjusting device according to an embodiment of the present disclosure may generate a deep neural network model for predicting an appropriate volume of the electronic device according to a status of noise around the electronic device, the type of the video content displayed on the electronic device, and the user viewing the video content, by using at least portion of the volume information about the electronic device when the electronic device is turned on, the volume information about the electronic device adjusted and changed by the user when the content is changed, the type of the video content displayed on the electronic device, information about the correlation between the noise around the electronic device and the volume information about the electronic device when the video content is displayed, and facial information about the user when a volume of the electronic device is changed.

That is, the volume information about a video displayed on the electronic device may be learned under various conditions. In particular, a desired volume is learned according to a user who views video content, and related video content is displayed at the volume preferred by the user when the related video content is displayed so that the user may listen to the video content at the preferred volume.

The volume adjusting device according to an embodiment of the present disclosure may include a user determination unit, which detects either turning on of the electronic device or changing of the video content, and determines whether a viewer viewing the video content displayed on the electronic device is the user detected by the facial information reception unit on the basis of the facial information, wherein when the viewer is determined to be the user, the device control unit may adjust the volume of the electronic device to a volume suitable for the user predicted by the deep neural network model.

In detail, when the user who is viewing a video is a previously detected user who changed the volume of a video, the video may be displayed at a volume preferred by the user by matching video content on the basis of learned information.

The user determination unit of the volume adjusting device according to an embodiment of the present disclosure may detect either turning on of the electronic device or changing of the video content, and determine whether there are a plurality of viewers viewing the video content on the basis of the facial information, and when it is determined that there are the plurality of viewers, the device control unit may adjust the volume of the electronic device to a volume suitable for a first viewer among the plurality of viewers, wherein the first viewer may have a highest volume among suitable volumes predicted by the deep neural network model.

In detail, when a plurality of viewers are viewing a single channel, a video is displayed on the basis of information indicating a higher volume at which the channel is listened to, so that the viewers may listen to the displayed video even while having a conversation.

A method for adjusting a volume of an electronic device according to an embodiment of the present disclosure may include receiving volume information about an electronic device adjusted by a user, learning a correlation between the volume information about the electronic device and video content displayed through the electronic device, storing a prediction model of an operation executable by the electronic device according to a type of the video content displayed on the electronic device on the basis of the learned correlation between the volume information about the electronic device and the video content, and controlling the electronic device so that the predicted operation executable by the electronic device is executed by the electronic device when the video content displayed through the electronic device is detected.

By using this method, the volume of video content may be automatically adjusted to a volume preferred by a user.

The receiving may include receiving noise generated around the electronic device, receiving volume adjustment information about the electronic device when change information about the video content displayed on the electronic device is generated, and detecting facial information about the user adjusting a volume of the electronic device.

That is, the noise generated around the electronic device, the volume information adjusted when content is changed, and the volume information about the electronic device preferred by each user who adjusts the volume may be received.

The receiving the noise according to an embodiment of the present disclosure may include receiving the noise from a point of time at which the electronic is turned on, or receiving the noise when a variation in the volume of the electronic device is at least a preset threshold value.

In detail, when the surrounding noise is larger than the volume of a video while the video is being displayed, the volume of the video may be adjusted higher. As described above, information about noise for which volume adjustment is required may be learned, and the volume may be automatically changed to display a video without being adjusted by a user when noise which matches learned noise occurs.

The storing the facial information of the method according to an embodiment of the present disclosure may include receiving a face of the user when the electronic device is turned on or when a volume adjustment operation of the electronic device is performed.

In detail, the volume of the electronic device may be adjusted when the electronic device is operated. Therefore, the facial information about the user who adjusts the volume of the electronic device when the electronic device is operated may be received, and the received facial information about the user may be used as learned information. Thereafter, when a user operating the electronic device matches a learned user on the basis of the learned facial information, a video may be displayed at a volume preferred by the learned user.

The learning of the method according to an embodiment of the present disclosure may include generating a deep neural network model for predicting an appropriate volume of the electronic device according to a status of noise around the electronic device, the type of the video content displayed on the electronic device, and the user viewing the video content, by using at least portion of the volume information about the electronic device when the electronic device is turned on, the volume information about the electronic device adjusted and changed by the user when the content is changed, the type of the video content displayed on the electronic device, information about the correlation between the noise around the electronic device and the volume information about the electronic device when the video content is displayed, and facial information about the user when a volume of the electronic device is changed.

That is, the volume information about a video displayed on the electronic device may be learned under various conditions. In particular, a desired volume is learned according to a user who views video content, and related video content is displayed at the volume preferred by the user when the related video content is displayed so that the user may listen to the video content at the preferred volume.

The method according to an embodiment of the present disclosure may include user determination including detecting either turning on of the electronic device or changing of the video content and determining whether a viewer viewing the video content displayed on the electronic device is the user detected previously on the basis of the facial information, wherein the user determination may include adjusting the volume of the electronic device to a volume suitable for the user predicted by the deep neural network model.

In detail, when the user who is viewing a video is a previously detected user who changed the volume of a video, the video may be displayed at a volume preferred by the user by matching video content on the basis of learned information.

The user determination of the method according to an embodiment of the present disclosure may include detecting either turning on of the electronic device or changing of the video content, determining whether there are a plurality of viewers viewing the video content on the basis of the facial information, and adjusting the volume of the electronic device to a volume suitable for a first viewer among the plurality of viewers when it is determined that there are the plurality of viewers, wherein the first viewer may have a highest volume among suitable volumes predicted by the deep neural network model.

In detail, when a plurality of viewers are viewing a single channel, a video is displayed on the basis of information indicating a higher volume at which the channel is listened to, so that the viewers may listen to the displayed video even while having a conversation.

Other aspects, features, and advantages of the present disclosure will become apparent from the detailed description and the claims in conjunction with the accompanying drawings.

BRIEF DESCRIPTION OF THE DRAWINGS

The above and other aspects, features, and advantages of the present disclosure will become apparent from the detailed description of the following aspects in conjunction with the accompanying drawings, in which.

DETAILED DESCRIPTION

Figure 1:
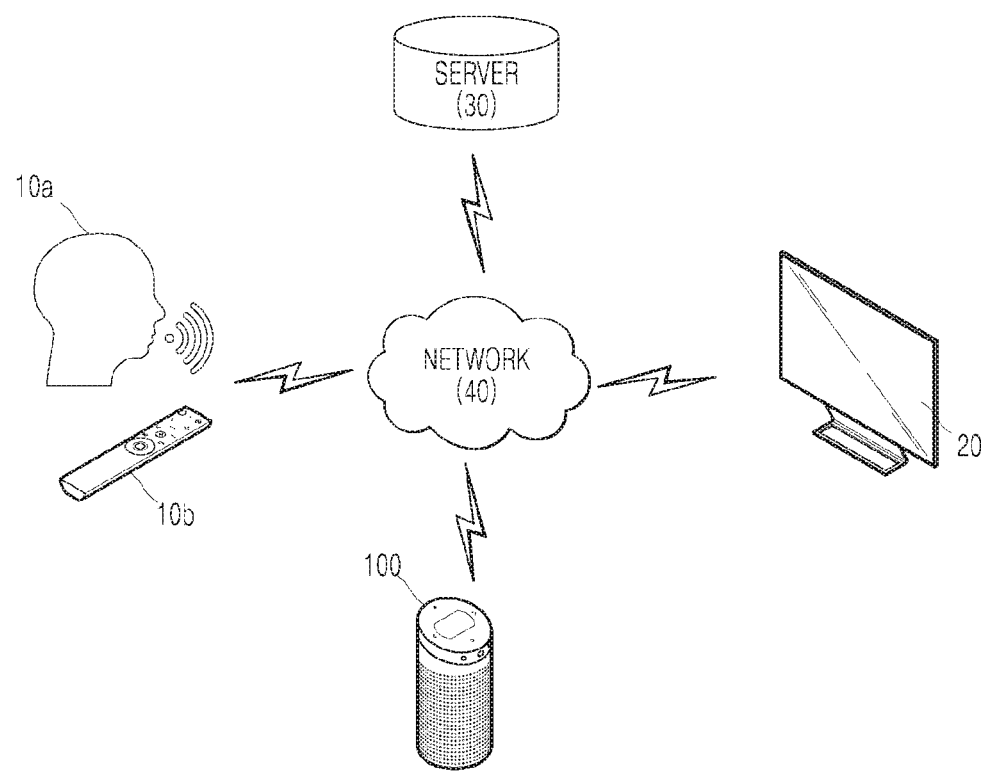
FIG. 1 is an exemplary diagram illustrating an electronic device volume control environment including a user, a remote controller, an electronic device, a volume adjusting device, a server, and a network for connecting the foregoing elements according to an embodiment of the present disclosure.

Advantages and features of the present disclosure and methods for achieving them will become apparent from the descriptions of aspects herein below with reference to the accompanying drawings. However, the present disclosure is not limited to the aspects disclosed herein but may be implemented in various different forms, and should be construed as including all modifications, equivalents, or alternatives that fall within the sprit and scope of the present disclosure. The aspects are provided to make the description of the present disclosure thorough and to fully convey the scope of the present disclosure to those skilled in the art. In relation to describing the present disclosure, when the detailed description of the relevant known technology is determined to unnecessarily obscure the gist of the present disclosure, the detailed description may be omitted.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. Although the terms first, second, etc. may be used herein to describe various elements, these elements should not be limited by these terms. These terms may be only used to distinguish one element from other elements.

Hereinafter, embodiments of the present disclosure will be described in detail with reference to the accompanying drawings. Like reference numerals designate like elements throughout the specification, and overlapping descriptions of the elements will not be provided.

Hereinafter, smart lighting according to an embodiment of the present disclosure will be described in detail with reference to the accompanying drawings.

FIG. 1 is an exemplary diagram illustrating an electronic device volume control environment including a user, a remote controller, an electronic device, a volume adjusting device, a server, and a network for connecting the foregoing elements according to an embodiment of the present disclosure.

FIG. 1 illustrates a state in which a user 10a, a remote controller 10b, an electronic device 20, a volume adjusting device 100, and a server 30 are communicatively connected to each other by a network 40. The volume adjusting device 100 includes an additional communication unit 11 (see FIG. 2), and thus may recognize a voice of the user 10a via the wired or wireless network 40, or may transmit and receive remote information of the remote controller 10b via the server 30.

The volume adjusting device 100, the user 10a, the remote controller 10b, and the server 30 may be connected to each other in a 5G communication environment. Furthermore, in addition to the devices illustrated in FIG. 1, various electronic devices used in home or office may be connected to each other to operate in an environment of the Internet of things.

The electronic device 20 may be one of various electronic devices used in home or office, and is exemplarily described as a TV below. However, it is obvious that the electronic device 20 is not limited to a TV, and may be any one of devices (e.g., a projector or the like) for viewing images and devices (e.g., a washing machine, a refrigerator, or the like) for generating a result of an operation performed by a device as a voice.

The volume adjusting device 100 may receive a speech uttered by the user 10a, and may recognize and analyze the speech of the user to provide a related service. To this end, the volume adjusting device 100 may include an artificial intelligence (AI) speaker, and may serve as a hub for controlling an electronic device having no voice input/output function.

For example, the speech uttered by the user 10a may be a specific command for activating a voice function of the volume adjusting device 100, and may be referred to as a wake-up word. For example, the speech uttered by the user 10a may be a command such as "turn the TV volume up" or "turn the TV volume down". Such a command may be preset and stored in a memory 160 described below.

The user 10a may utter a speech related to operation information about the electronic device 20. Here, the speech uttered by the user 10a may be referred to as, for example, a command for turning on/off the electronic device 20, a command for adjusting a volume of the electronic device 20, or the like.

Furthermore, a command for operating the electronic device 20 may be generated by the remote controller 10b rather than the voice of the user 10a. To this end, the remote controller 10b and the electronic device 20 may be connected to each other in a 5G communication environment as described above.

In a specific example, if the user 10a utters the wording "turn the TV volume up" towards the volume adjusting device 100 when the user 10a desires to adjust the volume of a TV among the electronic devices 20 by voice or the remote controller 10b, a command of "TV volume increase" may be received by the server 30. Therefore, the volume of the TV may be increased, and increased TV volume information (e.g., volume level) may be stored in the memory 160.

Likewise, the volume of the TV may be increased using a volume button of the remote controller 10b other than the voice of the user 10a, and an operation of pressing the volume button may allow the command of "TV volume increase" to be received by the server 30. Therefore, the volume of the TV is increased, and increased TV volume information (e.g., volume level) is stored in the memory 160.

Here, the remote controller 10b may be one of devices capable of remotely controlling each electronic device 20, and it would be obvious that any device capable of remotely controlling the electronic device 20 may be used.

The server 30 may be a database server, which provides big data required for applying a variety of artificial intelligence algorithms and data related to voice recognition. Furthermore, the server 30 may include a web server or application server for remotely controlling the remote controller 10*b* and the voice of the user 10*a* by using an application or a web browser installed in a user terminal (not shown) (e.g., a mobile terminal, a wearable device, or the like).

Artificial intelligence (AI) is an area of computer engineering and information technology that studies how to make computers perform things humans are capable of doing with human intelligence, such as reasoning, learning, self-improving, and the like, or how to make computers mimic such intelligent human behaviors.

In addition, artificial intelligence does not exist on its own, but is rather directly or indirectly related to a number of other fields in computer science. In recent years, there have been numerous attempts to introduce an element of AI into various fields of information technology to solve problems in the respective fields.

Machine learning is an area of artificial intelligence that includes the field of study that gives computers the capability to learn without being explicitly programmed. More specifically, machine learning is a technology that investigates and builds systems, and algorithms for such systems, that are capable of learning, making predictions, and enhancing its own performance on the basis of experiential data. Machine learning algorithms, rather than executing rigidly set static program commands, may take an approach that builds a specific model based on input data for deriving a prediction or decision.

The server 30 may receive an electronic device control command generated in the remote controller 10*b* and the voice of the user 10*a*, and may predict an operation executable by the electronic device 20 and corresponding to the received electronic device control command. Here, the operation executable by the electronic device 20 represents, for example, an operation of increasing or decreasing a volume. That is, a process of adjusting the volume of the electronic device 20 may be executed by the server 30.

The network 40 may serve to connect the volume adjusting device 100 and the electronic device 20. The network 40 includes, but is not limited to, wire-based networks such as LANs (local area networks), wide area networks (WANs), metropolitan area networks (MANs), and integrated service digital networks (ISDNs); or wireless networks such as wireless LANs, CDMA, Bluetooth communications, satellite communications, and so forth. Also, the network 40 may transmit or receive data using short-range communication and/or long-range communication technologies. Examples of the short-range communication technologies may include Bluetooth, radio frequency identification (RFID), infrared data association (IrDA), ultra-wideband (UWB), ZigBee, and wireless fidelity (Wi-Fi). Examples of the long-range communication technologies may include code division multiple access (CDMA), frequency division multiple access (FDMA), time division multiple access (TDMA), orthogonal frequency division multiple access (OFDMA), and single carrier frequency division multiple access (SC-FDMA).

The network 40 may include connection of network elements such as hubs, bridges, routers, switches, and gateways. The network 40 may include one or more connected networks, including a public network such as the Internet, as well as a private network such as a secure corporate private network, for example, a multiple network environment. Access to the network 30 may be provided through one or more wire-based or wireless access networks. Furthermore, the network 40 may support the Internet of things (IoT) for exchanging and processing information between distributed elements such as things or the like and/or 5G communication.

Figure 2:
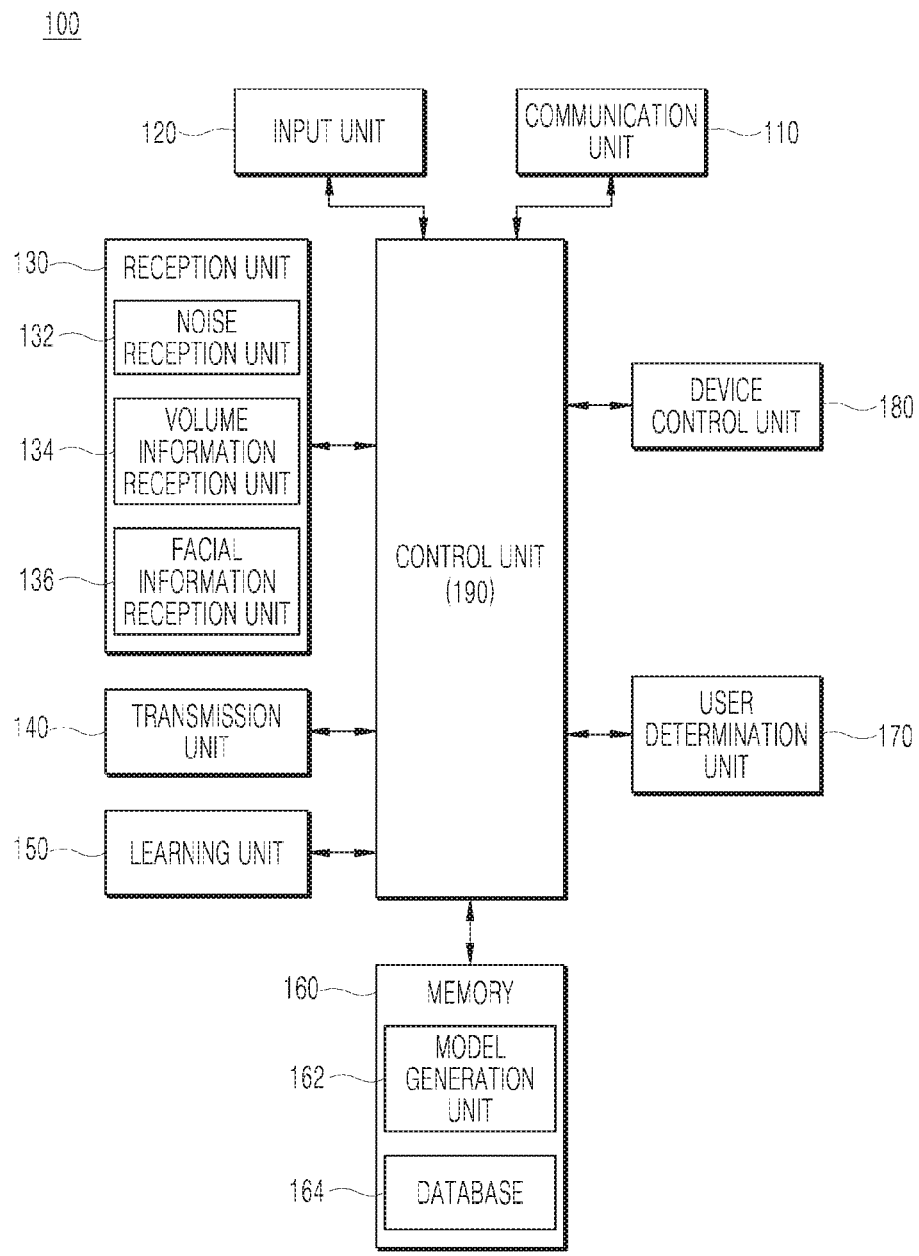
FIG. 2 is a schematic block diagram illustrating a volume adjusting device according to an embodiment of the present disclosure.
Figure 3:
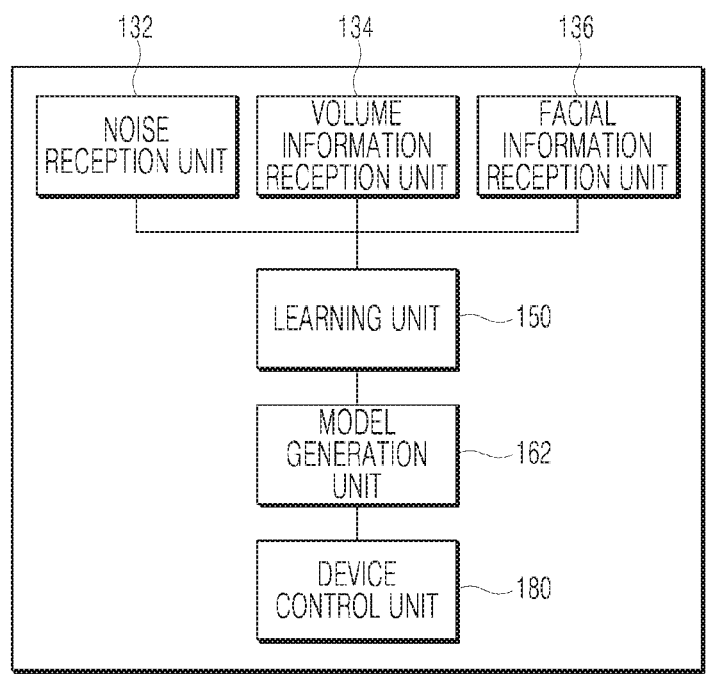
FIG. 3 is schematic block diagram illustrating a relationship between the reception unit, learning unit, and memory of FIG. 2.

FIG. 2 is a schematic block diagram illustrating a volume adjusting device according to an embodiment of the present disclosure, and FIG. 3 is schematic block diagram illustrating a relationship between the reception unit, learning unit, and memory of FIG. 2. Descriptions which overlap with the above descriptions related to FIG. 1 are not provided below.

Referring to FIGS. 2 and 3, the volume adjusting device 100 may include a communication unit 110, an input unit 120, a reception unit 130, a transmission unit 140, a learning unit 150, a memory 160, a user determination unit 170, and a device control unit 180.

The communication unit 110 may interwork with the user 10*a* and the remote controller 10*b* to provide a communication interface required for providing, in a form of packet data, an electronic device control command signal input to the remote controller 10*b*.

Furthermore, the communication unit 110 may serve to receive a predetermined information request signal from the electronic device 20 and/or the remote controller 10*b*, and may serve to process a speech uttered by the user 10*a* and transmit the processed speech to the electronic device 20. Furthermore, the communication unit 110 may be a device including hardware and software required for transmitting/receiving signals such as a control signal and a data signals via a wire/wireless connection to another network device.

In the present embodiment, another electronic device may represent an electronic device or the like which expresses, by voice, an operation of a home appliance not having a voice input/output function, such as, an air conditioner, a refrigerator, a washing machine, or the like.

The input unit 120 may include a voice input unit and a button input unit. This input unit 120 may input a control command of the electronic device 20 via a button or a user's voice. For example, when the user 10*a* utters a control command for controlling the volume of the TV, the control command of the TV may be input via the voice input unit, and, when the control command for controlling the volume of the TV is input via the remote controller 10*b*, the control command of the TV may be input via the button input unit.

To this end, the voice input unit may include at least one microphone (not shown). Furthermore, the voice input unit may include a plurality of microphones (not shown) for more accurately receive a voice of the user 10*a*. Here, the plurality of microphones may be arranged spaced apart from each other at different indoor positions, and may process a received voice signal of the user 10*a* into an electric signal.

In addition, the input unit 120 may use various noise elimination algorithms to eliminate noise generated while receiving the speech of the user. Furthermore, the input unit 120 may include various elements for processing a voice signal, such as a filter (not shown) for eliminating noise when receiving the speech of the user and an amplifier (not shown) for amplifying and outputting a signal output from the filter.

Furthermore, the input unit 120 may convert the voice signal of the user 10*a* input via the input unit 120 into a text, and may extract from the text a control command for controlling the volume of the TV. The input unit 120 may select any one word from the extracted control command on the basis of a prestored word. When any one word is selected, the control unit 190 may execute the control command processed by the input unit 120 as a control command for controlling the volume of the TV, and, as a result, the volume of the TV may be adjusted according to the control command.

The reception unit 130 may communicate with the server 30, and may receive information about the volume of the electronic device 20 adjusted by the user 10a. In the present embodiment, the reception unit 130 may include a noise reception unit 132 for receiving noise generated around the electronic device 20, a volume information reception unit 134 for receiving volume adjustment information about the electronic device 20 when a channel is changed in the electronic device 20, and a facial information reception unit 136 for storing facial information about the user who adjusts the volume of the electronic device 20.

In detail, the noise reception unit 132 may receive noise generated around the TV. For example, while viewing and listening to a displayed video, the user may suddenly increase the volume of the video due to noise coming from the outside. Here, the noise reception unit 132 may receive the noise generated around the TV to determine a level of noise at which the TV volume is increased.

To this end, the noise reception unit 132 may receive noise from a turn-on time at which power is supplied to the TV or a screen of the TV is turned on, or may receive noise when a variation in the volume of the electronic device 20 is at least a preset threshold value.

In detail, the noise reception unit 132 may receive noise during an entire time when the user views a video. Here, when the user rapidly increases a volume, a variation in the level of received noise may be compared. Thereafter, when it is determined that the volume is increased as the level of noise increases, related noise information may be transmitted to the learning unit 150 via the transmission unit 140.

Here, the noise information transmitted to the learning unit 150 may be a reference value based on a threshold value at which the user who is viewing the TV increases the TV volume. By learning this noise information that increases the TV volume, the TV volume may be automatically adjusted when related noise is received, so as not to give inconvenience to the user even if noise occurs.

The volume information reception unit 130 may receive volume information about a channel changed by the user. For example, it is assumed that the user is viewing a news channel, and sets the TV volume to volume level 3 when viewing the news channel. Thereafter, the user may change a channel from the news channel to a music channel, and may change the TV volume to volume level 6. As described above, TV volume information based on a channel change may be received, and the received information may be transmitted to the learning unit 150 via the transmission unit 140 and may be learned by the learning unit 150, so as to be used to automatically change the TV volume when the user changes a channel from the news channel to the music channel.

The facial information reception unit 136 may receive a face of the user who changes a channel. The received facial information about the user may be used to automatically adjust the volume according to different users who view the same type of content at different volumes.

That is, the volume set by user 1 who views a news channel may be volume level 3, but the volume set by user 2 who views the same news channel may be volume level 5. Therefore, since the faces of users are stored, the volume may be automatically set to volumes corresponding to the users according to stored user information even if the same channel is viewed by the users.

Here, the facial information reception unit 136 may store the face of the user at a point of time at which the electronic device is turned on or a point of time at which the volume of the electronic device 20 is adjusted. In detail, the user may adjust the volume of the TV while turning on the TV which is in an off state. At this moment, the face of the user adjusting the volume of the TV may be stored. In another case, the user may change a channel in a state in which the TV is turned on, and may adjust the volume according to a changed channel. At this moment, the face of the user who has adjusted the volume while attempting to change a channel may be stored.

The stored face of the user may be learned by the learning unit 150, and, thereafter, by using learned information, the volume of the TV may be automatically adjusted according to channel information and the user who adjusts the volume of the TV.

As described above, when the volume information about the electronic device 20 is received, the received information may be learned via the learning unit 150. In detail, the learning unit 150 may learn a correlation between the volume information about the electronic device 20 and video content generated and displayed through the electronic device 20.

Here, the content is exemplarily described as a TV channel in the above embodiment, but the TV channel may specifically represent any one type of a broadcast such as a music broadcast, news, movie, soap opera, entertainment, advertisement, etc. Such information may be attached to video data as additional information so as to be received. According to such content, the learning unit 150 learns the correlation between the type of a broadcast and a volume at which the broadcast is listened to and the correlation between the type of a broadcast and an increase/decrease in the volume.

For example, the learning unit 150 may generate a deep neural network model for predicting an appropriate volume of an electronic device according to a status of noise around the electronic device 20, the type of video content displayed in the electronic device, and the user viewing the video content, by using at least portion of information about the volume of the electronic device 20 when the electronic device 20 is turned on, information about the volume of the electronic device 20 adjusted and changed by the user when content is changed, the type of video content displayed through the electronic device 20, information about the correlation between noise around the electronic device 20 and the volume information about the electronic device 20 when video content is displayed, and the facial information about the user 10a when the volume of the electronic device 20 is changed.

In detail, in the case of the above example, when the noise reception unit 132 receives noise generated around the TV, the degree of a TV volume adjusted by the user according to the magnitude of the received noise may be learned. For example, a variation in the magnitude of the noise received by the noise reception unit 132 may be equal to or larger than a preset threshold value. That is, when the user feels as if the surrounding noise is larger than the volume of the TV, the user increases the volume of the TV. The learning unit 150 may learn information about noise for which the user increases the volume of the TV. On the basis of this learned information, the device control unit 180 may automatically increase the volume of the TV when the noise for which the user increases the volume of the TV occurs.

Furthermore, in another embodiment, the volume information reception unit 130 may receive volume information about a channel changed by the user. For example, it may be assumed that the user sets the volume to volume level 3 to view a news channel. Here, when the user changes a channel from the news channel to a music channel, the user may set the volume to volume level 6 to view the music channel. This TV volume information based on a channel change may be learned by the volume information reception unit 130. Here, when the user changes a channel to the music channel, the TV volume may be changed on the basis of the learned volume information, and thus the user may view the channel at a preferred volume.

In another embodiment, the face of the user around the TV may be learned from a point of time at which the TV is turned on and/or the face of the user may be learned when a channel is changed. In detail, the user may adjust the volume of the TV while operating the TV. At this moment, the face of the user adjusting the TV volume may be received by the facial information reception unit 136, and when TV is re-operated and it is determined that the received face matches the learned face of the user in a state in which the face of the user has been learned, the volume of the TV is set to a volume preferred by the user whose face has been learned. Meanwhile, the user may adjust the volume of the TV when changing a channel (e.g., news channel→music channel). Here, the face of the user adjusting the volume may be learned, and when it is determined that the channel is changed from a news channel to a music channel, and the user who has changed the channel is a pre-learned user, the volume of the TV may be automatically adjusted on the basis of stored TV volume information.

To this end, the volume adjusting device 100 may include an image sensor for recognizing the face of the user, a proximity sensor for recognizing the user near the TV, etc. In detail, the proximity sensor may obtain location data of the user (object) positioned near the volume adjusting device 100 using infrared light or the like. The image sensor may include at least one camera for capturing an image or shooting a video of surroundings of the volume adjusting device 100.

The volume adjusting device 100 may further include the user determination unit 170 for determining whether a learned face of the user matches a stored face of the user. That is, when it is detected that the electronic device 20 is turned on or the user changes video content (e.g., changes a channel), the user determination unit 170 may determine whether a viewer who is viewing video content displayed on the electronic device 20 is the user detected by the facial information reception unit 136 on the basis of the facial information.

When it is determined that the viewer who is viewing the video content is the user adjusting the volume of the electronic device 20, the device control unit 180 may adjust the volume of the electronic device 20 to a volume suitable for the user predicted by the deep neural network model.

In detail, the facial information reception unit 136 and the volume information reception unit 134 may receive the face of viewer 1 who is viewing a music broadcast and a volume at which viewer 1 listens to the music broadcast. Thereafter, when the TV is changed from an off state to an on state, and it is determined that the user near the TV is viewer 1 on the basis of a video and/or image obtained by the image sensor, the TV volume may be set to the volume at which viewer 1 listened to the music broadcast.

Here, the user determination unit 170 detects either turning on of the electronic device 20 or changing a channel of the electronic device 20, but there may be a plurality of users who change a channel. In this case, a priority may be given to the user requiring volume adjustment so as to adjust the volume of the electronic device 20. In detail, when two or more viewers are viewing the TV, the volume of the electronic device 20 may be adjusted on the basis of information about a first viewer, the information indicating that a channel is listened to at a high volume.

This user determination unit 170 may be any one of devices capable of determining whether a stored user image matches a user image obtained from the image sensor.

The memory 160 may store a prediction model of an operation executable by the electronic device 20 between the volume information about the electronic device 20 and a channel of a video displayed through the electronic device 20. In detail, the memory 160 may store the prediction model of an operation executable by the electronic device 20 on the basis of any one among information about the volume of the electronic device 20 when the electronic device 20 is turned on, information about the volume of the electronic device 20 when a channel is changed, and information about the volume of the electronic device 20 while a video is displayed through the electronic device 20. To this end, the memory 160 may include a model generation unit 162 and a database 164 for generating an operation executable by the electronic device 20, in a manner that is stored in the memory 160.

For example, when the user who is a TV viewer viewing a music channel utters the wording "turn up the TV volume", the term "volume" may be a language for selecting a setting of the TV, and the term "turn up" may be a command for controlling the volume of the TV. As described above, when the user utters the wording "turn up the volume", a volume setting of the TV may be changed, and information about a channel for which the volume setting is changed is stored.

In detail, the memory 160 may store a prediction model for automatically increasing the TV volume when the level of noise generated around the TV is equal to or larger than a preset threshold value and the noise having a level equal to or larger than the threshold value is received.

According to the above embodiment, the generated noise may be a reference value based on a threshold value at which the user who is viewing the TV increases the TV volume. By learning this noise information that increases the TV volume, the TV volume may be automatically adjusted when related noise is received, so as not to give inconvenience to the user even if noise occurs.

Furthermore, the memory 160 may store information indicating that the volume is set to volume level 3 on the basis of minimum volume level 0 when a news channel is viewed, and may store a prediction model for automatically adjusting the volume of the TV to prestored volume level 6 when the user changes a channel from a news channel to a music broadcast channel according to information indicating that the volume is set to volume level 6 when a music broadcast is viewed.

Furthermore, the memory 160 may store a prediction model for storing the volume of the electronic device 20 according to the face of the user stored in the facial information reception unit 136. In detail, the user may set the volume of the TV to volume level 3 while operating the TV. Likewise, the user may adjust the volume of the TV from volume level 3 to volume level 6 when changing a channel (e.g., news channel→music channel). As described above, a prediction model may be stored, which automatically adjusts the volume of the TV when a channel of the TV is changed in a state in which the user who changes a channel is learned on the basis of the face of the user adjusting the volume of the TV and information indicating a situation in which the volume is adjusted.

Here, the memory 160 stores a prediction model for adjusting the TV volume corresponding to pre-learned contents according to a speech command of the user 10a according to channel.

The memory 160, which stores a variety of information required for operating the server 30 in addition to the prediction model, may include a volatile or non-volatile recording medium. The recording medium is configured to store data readable by the control unit 190, and may include a hard disk drive (HDD), solid state disk (SSD), silicon disk drive (SDD), ROM, RAM, CD-ROM, a magnetic tape, a floppy disk, a light data storage device, and the like.

The memory 160 may store limited data. For example, the memory 160 may store a preset language for determining a control command from a speech uttered by the user and/or the remote controller 10b. As described above, the term "volume" included in the wording "turn up the TV volume" uttered by the user may be set as a language for matching the electronic device 20, and the term "turn up" may be set as a language for changing an operation setting (e.g., TV volume increase) of the electronic device. This control command may be preset by the prediction model as described above, but may be set and changed by the user.

As described above, when an operation executable by the electronic device 20 based on the prediction model is stored, and video display is detected through the electronic device 20, the device control unit 180 may be controlled so that the operation executable by the electronic device 20 is executed by the electronic device 20.

In detail, when the user sets a channel of the TV in a state in which the memory 160 stores an operation executable by the TV between a channel and the TV as described above, the volume of the TV is adjusted on the basis of the prestored prediction model.

The control unit 190 may control a command signal input to the volume adjusting device 100 so as to automatically adjusting the volume of the TV according to the correlation between a channel and learned volume information about the TV. The control unit 190, which is a type of a central processing unit, may provide various functions for adjusting the volume of the TV by driving control software installed in the memory 160.

Here, the control unit 190 may include any type of devices capable of processing data, such as a processor. Here, the 'processor' may refer to a data processing device built in a hardware, which includes physically structured circuits in order to perform functions represented as a code or command contained in a program. Examples of the data processing device built in a hardware include, but are not limited to, processing devices such as a microprocessor, a central processing unit (CPU), a processor core, a multiprocessor, an application-specific integrated circuit (ASIC), a field programmable gate array (FPGA), and the like.

The server 30 of the present embodiment may perform machine learning such as deep learning or the like in response to an electronic device control command input by the user. To this end, the memory 160 may store result data or the like used in the machine learning.

Deep learning, which is a subfield of machine learning, enables data-based learning through multiple layers. As the number of layers in deep learning increases, the deep learning network may acquire a collection of machine learning algorithms that extract core data from multiple datasets.

Deep learning structures may include an artificial neural network (ANN), and may include a deep neural network (DNN) such as a convolutional neural network (CNN), a recurrent neural network (RNN), a deep belief network (DBN), and the like. The deep learning structure according to the present embodiment may use various structures well known in the art. For example, the deep learning structure according to the present disclosure may include a CNN, an RNN, a DBN, and the like. The RNN, which is frequently used for processing natural language, is an efficient structure for processing time-series data that varies with time, and may constitute an artificial neural network by stacking layers up every moment. DBN includes a deep learning structure formed by stacking up multiple layers of restricted Boltzmann machines (RBM), which is a deep learning scheme. A DBN has the number of layers formed by repeating RBM training. CNN includes a model mimicking a human brain function, built on the assumption that when a person recognizes an object, the brain extracts basic features of the object and recognizes the object based on the results of complex processing in the brain.

Meanwhile, the artificial neural network can be trained by adjusting connection weights between nodes (if necessary, adjusting bias values as well) so as to produce desired output from given input. Also, the artificial neural network can continuously update the weight values through learning. Furthermore, methods such as back propagation may be used in training the artificial neural network.

As described above, the server 30 may be provided with an artificial neural network and perform machine learning-based user recognition and user's voice recognition using received audio input signals as input data.

The controller 190 may include an artificial neural network, for example, a deep neural network (DNN) such as CNN, RNN, DBN, and the like, and may train the DNN. Both unsupervised learning and supervised learning may be used as a machine learning method of the artificial neural network. Specifically, the control unit 190 may control such that a voice color recognition artificial neural network structure is updated after training according to settings.

Figure 4:
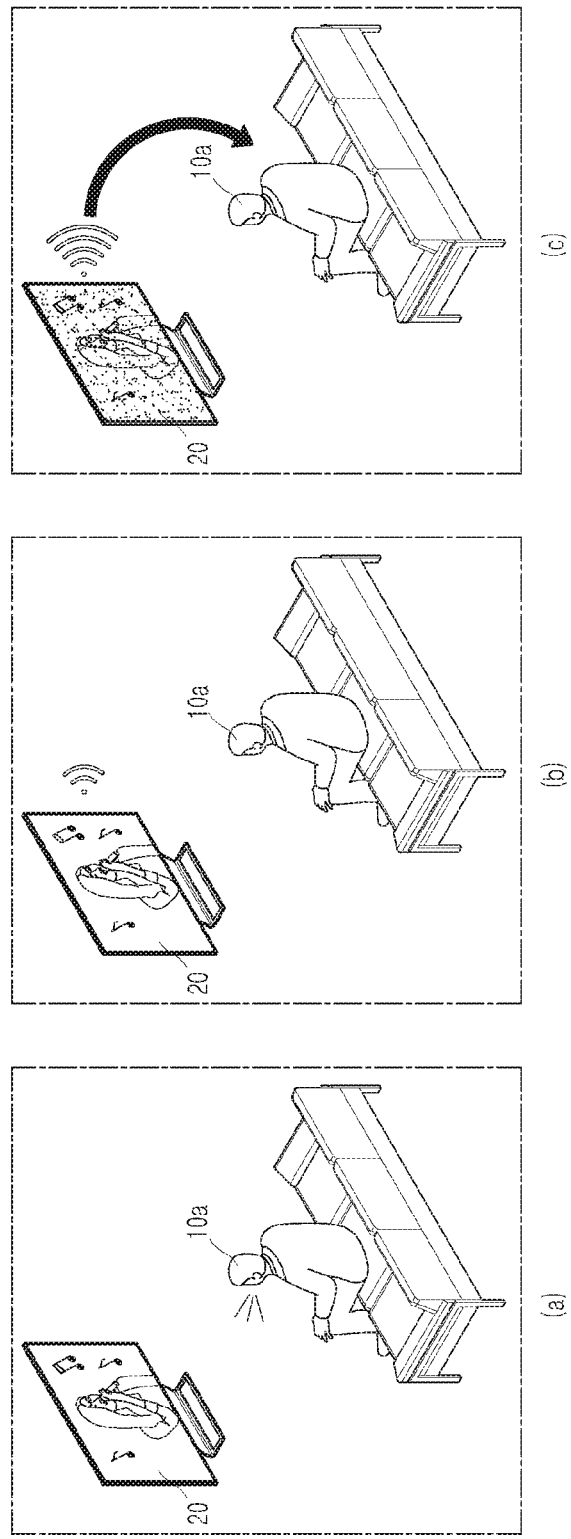
FIG. 4 is a diagram illustrating an example in which the volume of an electronic device is adjusted according to an embodiment of the present disclosure.

FIG. 4 is a diagram illustrating an example in which the volume of an electronic device is adjusted according to an embodiment of the present disclosure. Descriptions which overlap with the above descriptions related to FIGS. 1 to 3 are not provided below.

FIG. 4A illustrates an example in which a voice command of the user 10a is input through the input unit 120 when the user 10a utters the voice command while viewing a music channel. Here, the user may utter, for example, the wording "turn up the TV volume".

FIG. 4B illustrates an example in which the voice command uttered by the user is learned. For example, on the assumption that the volume of the TV has been set to volume level 3 previously (FIG. 4A), the volume of the TV may be gradually increased to volume level 4 or higher to display a video since the user utters the wording "turn up the TV volume". Here, since the volume of the TV is gradually increased, the user may utter the wording "turn down the TV volume" or may utter a volume increase stop command such as "stop turning up the volume". For example, on the assumption that the volume of the TV is volume level 6 when the user utters the wording "stop turning up the volume", the memory 160 of the volume adjusting device 100 may store a learning result that the volume preferred by the user who views a music channel is volume level 6.

FIG. 4C illustrates an example in which TV volume information about a specific channel is stored, and when the specific channel is selected, a video is displayed at a stored TV volume. That is, when the user selects a music channel according to the above embodiment, the volume of the TV is set to volume level 6 on the basis of learned information so as to display a music broadcast.

Figure 5:
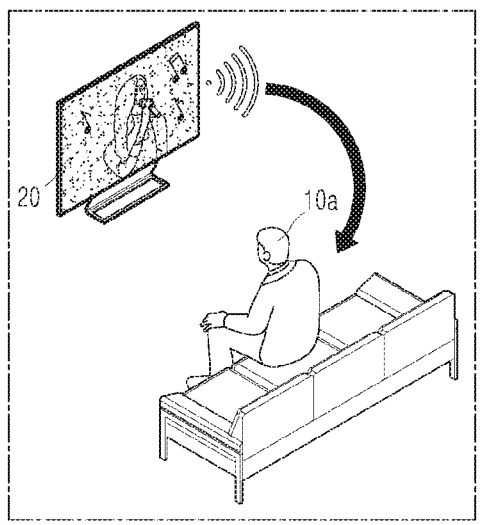
FIG. 5 is a diagram illustrating an example in which the volume of an electronic device is adjusted according to another embodiment of the present disclosure.
Figure 5:
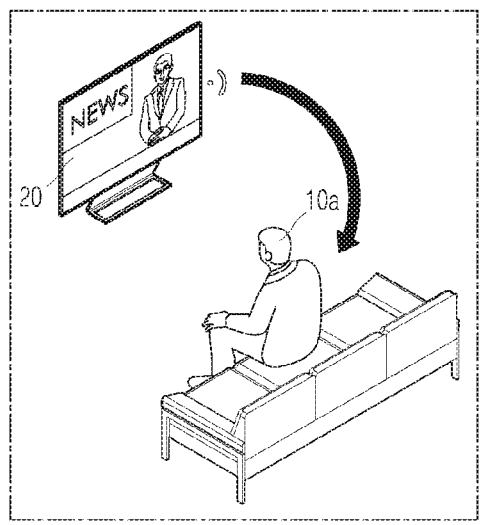

FIG. 5 is a diagram illustrating an example in which the volume of an electronic device is adjusted according to another embodiment of the present disclosure. Descriptions which overlap with the above descriptions related to FIGS. 1 to 4 are not provided below.

The following descriptions are provided on the assumption that it has been learned that the user sets the volume of the TV to volume level 6 when the user views a music channel as described above with reference to FIG. 4, and, likewise, the user sets the volume of the TV to volume level 3 when the user views a news channel.

FIG. 5A illustrates an example in which the user 10a views a music channel. Here, when the user changes a channel from the music channel to a news channel, the user may generate a channel change command using a voice command and/or a remote controller.

FIG. 5B illustrates an example in which a channel of the TV is changed, and a channel video is displayed at a learned volume according to the changed channel. That is, the video displayed in FIG. 5A is a music channel, and it has been learned that the user sets the volume to volume level 6 when viewing the music channel. Here, when the channel is changed to the news channel, it is determined that the user listens to the TV at volume level 3 according to pre-learned information, and the volume of the TV may be reduced to display a video.

Figure 6:
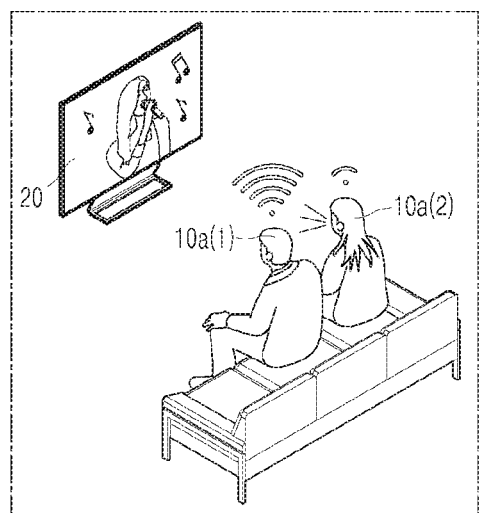
FIG. 6 is a diagram illustrating another example in which the volume of an electronic device is adjusted according to an embodiment of the present disclosure.
Figure 6:
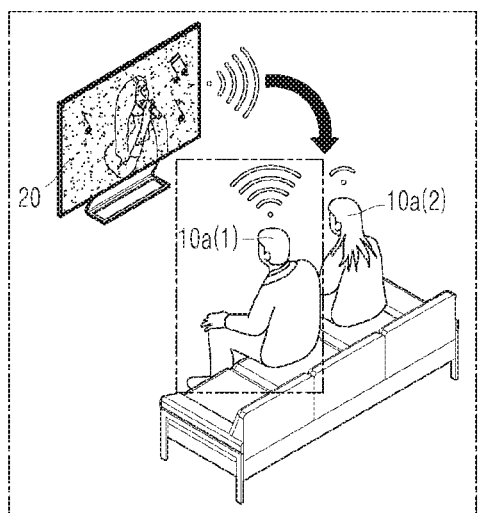

FIG. 6 is a diagram illustrating another example in which the volume of an electronic device is adjusted according to an embodiment of the present disclosure. Descriptions which overlap with the above descriptions related to FIGS. 1 to 5 are not provided below.

FIG. 6 illustrates that two viewers (a first viewer 10a(1), a second viewer 10a(2)) are viewing a music channel. Here, the volume adjusting device 100 may learn that the first user 10a(1) sets the volume of the TV to volume level 6 when viewing a music channel, and the second user 10a(2) sets the volume of the TV to volume level 2 when viewing the music channel.

In this case, the volume adjusting device 100 may display a video on the basis of learned information indicating a higher volume at which a video is displayed. Here, the volume adjusting device 100 may preferentially determine whether there are a plurality of viewers viewing the TV by using the user determination unit 170, and may set the volume of the TV on the basis of information pertaining to a user who listens to a channel at a higher volume among the users.

Therefore, when a plurality of viewers are viewing a single channel, a video is displayed on the basis of information indicating a higher volume at which the channel is listened to, so that the viewers may listen to the displayed video even while having a conversation.

Meanwhile, it has been exemplarily described that when a plurality of users are viewing a single channel, the volume of the TV is adjusted on the basis of the volume information about a user who listens to the channel at a higher volume in an embodiment of the present disclosure, but it would be obvious that the volume of the TV may be adjusted on the basis of the volume information about a user who listens to the channel at a lower volume.

Figure 7:
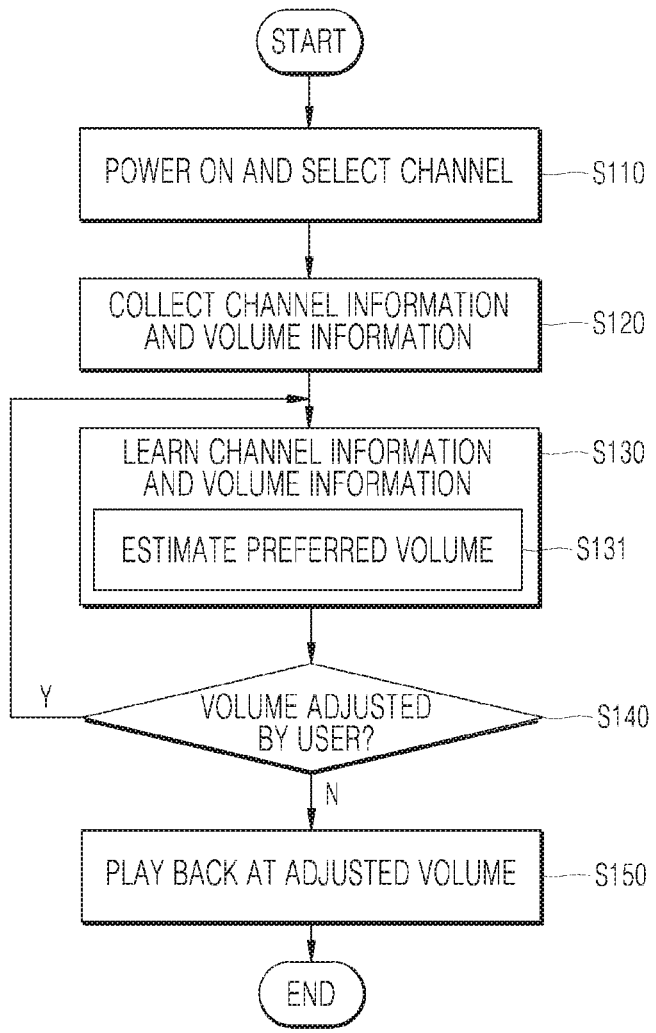
FIG. 7 is a schematic flowchart illustrating a volume adjusting method according to an embodiment of the present disclosure.

FIG. 7 is a schematic flowchart illustrating a volume adjusting method according to an embodiment of the present disclosure. In the following descriptions, the elements referred to by the same reference numerals as those illustrated in FIGS. 1 to 6 are assumed to be the same elements as illustrated in FIGS. 1 to 6, and are thus not described in detail.

Referring to FIG. 7, the user 10a who views a TV for displaying a video among the electronic devices 20 may turn on the TV, or may select a channel to be viewed from a turned on TV (S110).

Here, information about the channel being viewed by the user who is viewing the TV and volume information about the channel may be collected (S120). The information about the channel may represent information about a channel being viewed, such as a music channel, a news channel, a sports channel, or the like. The volume information about the channel may represent volume level information about a channel being viewed. For example, "the user is currently viewing a music channel (channel information, and the volume of the channel being viewed is set to volume level 6 (volume level information)" may be the channel information and the volume information about a channel.

When the channel information and the channel volume information are collected, the collected channel information and volume information may be learned (S130). In detail, during a learning operation, the correlation between the volume information about the TV and the information about the channel through which a video generated via the TV is displayed may be learned.

For example, any one among information about the volume of the electronic device 20 when the electronic device 20 is turned on, information about the volume of the electronic device 20 when a channel is changed, information about the volume of the electronic device 20 while a video is being displayed through the electronic device 20, information about the correlation between noise generated around the electronic device 20 and the volume information about the electronic device 20 when a video is displayed, and facial information about the user 10a when the volume of the electronic device 20 is changed may be learned.

According to the above example, when the noise generated around the TV is received, the degree of a TV volume adjusted by the user according to the magnitude of the received noise may be learned. Furthermore, the volume information about a channel changed by the user may be received, and the received volume information may be learned. Furthermore, the face of the user around the TV may be learned from a point of time at which the TV is turned on and/or the face of the user may be learned when a channel is changed.

Here, a volume preferred by the user when the user views the TV may be estimated according to a situation (S131). In detail, it may be assumed that the user increases the TV volume when the noise generated around the TV has at least a certain level of decibel (e.g., 65 dB). For example, it may be assumed that the user increases the volume of the TV by two levels when noise having at least a certain level is generated. That is, it may be estimated that the user prefers to increase the volume by two levels to view the TV when noise having at least a certain level is generated.

Furthermore, it may be assumed that the user sets the volume to volume level 3 to view a news channel. Thereafter, the user may change a channel from the news channel to a music channel, and may change the TV volume to volume level 6. According to the TV volume information based on a channel change, it may be estimated that the user prefers volume level 6 for the music channel and prefers volume level 3 for the news channel.

Here, when a preferred volume according to a channel is estimated, it may be determined whether the user additionally adjusts the volume of the TV (S140). That is, even after the volume of the TV is automatically adjusted according to a channel, the user may manually adjust the volume of the TV. This is because there may be two or more viewers allowed to view the TV in a home or office, and the viewers may have different preferred volumes for the same channel. When the volume of the TV is manually adjusted by the user, the adjusted TV volume may be re-learned.

Here, channel volume information according to users may be learned by recognizing the faces of the users, so that the volume of the TV may be set to different volumes when a first viewer views a music channel and a second viewer views the music channel.

Thereafter, when a specific channel (e.g., music channel) is selected, the volume of the TV may be adjusted on the basis of learned volume information so as to display (S150). Here, when two or more viewers are viewing the TV, and are viewing a single channel simultaneously, the volume of the TV may be adjusted on the basis of volume information about a viewer who listens to the channel at a higher volume. When the two or more viewers view the TV at different times, the volume of the TV may be adjusted on the basis of the volume information about each of the viewers so as to display.

Accordingly, the volume of the TV may be automatically adjusted according to a listening condition of the user so as to display a video, thereby providing a more comfortable viewing environment to the user.

According to the present disclosure, a preferred volume may be learned according to video content such as a movie, soap opera, advertisement, entertainment, music, news, or the like, and when video content is selected, the video content is displayed on the basis of learned information, so that the video may be listened to at a volume desired by a user.

Furthermore, according to the present disclosure, the volume of a device for displaying a video, such as a TV, may be automatically adjusted to a volume preferred by a user viewing video content according to the type of the video content, so as to provide a comfortable viewing environment to the user who uses the device for displaying a video.

Furthermore, according to the present disclosure, when a plurality of viewers are viewing a single piece of video content, a video is displayed on the basis of information indicating a higher volume at which the video is listened to, so that the viewers may listen to the displayed video even while having a conversation.

The example embodiments described above may be implemented through computer programs executable through various components on a computer, and such computer programs may be recorded in computer-readable media. Examples of the computer-readable media include, but are not limited to: magnetic media such as hard disks, floppy disks, and magnetic tape; optical media such as CD-ROM disks and DVD-ROM disks; magneto-optical media such as floptical disks; and hardware devices that are specially configured to store and execute program codes, such as ROM, RAM, and flash memory devices.

The computer programs may be those specially designed and constructed for the purposes of the present disclosure or they may be of the kind well known and available to those skilled in the computer software arts. Examples of program code include both machine code, such as produced by a compiler, and higher level code that may be executed by the computer using an interpreter.

As used in the present application (especially in the appended claims), the terms 'a/an' and 'the' include both singular and plural references, unless the context clearly states otherwise. Also, it should be understood that any numerical range recited herein is intended to include all sub-ranges subsumed therein (unless expressly indicated otherwise) and therefore, the disclosed numeral ranges include every individual value between the minimum and maximum values of the numeral ranges.

Also, the order of individual steps in process claims of the present disclosure does not imply that the steps must be performed in this order; rather, the steps may be performed in any suitable order, unless expressly indicated otherwise. In other words, the present disclosure is not necessarily limited to the order in which the individual steps are recited. The steps included in the methods according to the present disclosure may be executed by a process or modules for executing functions of corresponding steps. All examples described herein or the terms indicative thereof ("for example", etc.) used herein are merely to describe the present disclosure in greater detail. Therefore, it should be understood that the scope of the present disclosure is not limited to the example embodiments described above or by the use of such terms unless limited by the appended claims. Also, it should be apparent to those skilled in the art that various alterations, permutations, and modifications may be made within the scope of the appended claims or equivalents thereof.

The present disclosure is thus not limited to the example embodiments described above, and rather intended to include the following appended claims, and all modifications, equivalents, and alternatives falling within the spirit and scope of the following claims.

What is claimed is:

1. A volume adjusting device for automatically adjusting a volume, the volume adjusting device comprising:
   a reception unit configured to receive volume information about an electronic device adjusted by a user;
   a learning unit configured to learn a correlation between the volume information about the electronic device and video content displayed through the electronic device;
   a memory configured to store a prediction model of an operation executable by the electronic device according to a type of the video content displayed on the electronic device based on the correlation between the volume information about the electronic device and the video content; and
   a device control unit configured to control the electronic device so that the operation executable by the electronic device is executed by the electronic device when the video content displayed through the electronic device is detected,
   wherein the learning unit generates a deep neural network model for predicting an appropriate volume of the electronic device according to a status of noise around the electronic device, the type of the video content displayed on the electronic device, and the user viewing the video content, by using at least portion of the volume information about the electronic device when the electronic device is turned on, the volume information about the electronic device adjusted and changed by the user when the video content is changed, the type of the video content displayed on the electronic device, information about a correlation between the noise around the electronic device and the volume information about the electronic device when the video content is displayed, and facial information about the user when a volume of the electronic device is changed.

2. The volume adjusting device of claim 1, wherein the reception unit comprises:
 a noise reception unit configured to receive noise generated around the electronic device;
 a volume information reception unit configured to receive volume adjustment information about the electronic device when change information about the video content displayed on the electronic device is generated; and
 a facial information reception unit configured to detect the facial information about the user adjusting a volume of the electronic device.

3. The volume adjusting device of claim 2, wherein the noise reception unit receives the noise from a point of time at which the electronic is turned on, or receives the noise when a variation in the volume of the electronic device is at least a preset threshold value.

4. The volume adjusting device of claim 2, wherein the facial information reception unit stores the facial information of the user when the electronic device is turned on or when a volume adjustment operation of the electronic device is performed.

5. The volume adjusting device of claim 1, further comprising:
 a user determination unit configured to detect either turning on of the electronic device or changing of the video content, and determine whether a viewer viewing the video content displayed on the electronic device is the user detected by the facial information reception unit based on the facial information,
 wherein when the viewer is determined to be the user, the device control unit adjusts the volume of the electronic device to a volume suitable for the user predicted by the deep neural network model.

6. The volume adjusting device of claim 5, wherein the user determination unit detects either turning on of the electronic device or changing of the video content, and determines whether there are a plurality of viewers viewing the video content based on the facial information, and when it is determined that there are the plurality of viewers, the device control unit adjusts the volume of the electronic device to a volume suitable for a first viewer among the plurality of viewers,
 wherein the first viewer has a highest volume among suitable volumes predicted by the deep neural network model.

7. A method for adjusting a volume of an electronic device, the method comprising:
 receiving volume information about an electronic device adjusted by a user;
 learning a correlation between the volume information about the electronic device and video content displayed through the electronic device;
 storing a prediction model of an operation executable by the electronic device according to a type of the video content displayed on the electronic device based on the correlation between the volume information about the electronic device and the video content; and
 controlling the electronic device so that the operation executable by the electronic device is executed by the electronic device when the video content displayed through the electronic device is detected,
 wherein the learning comprises generating a deep neural network model for predicting an appropriate volume of the electronic device according to a status of noise around the electronic device, the type of the video content displayed on the electronic device, and the user viewing the video content, by using at least portion of the volume information about the electronic device when the electronic device is turned on, the volume information about the electronic device adjusted and changed by the user when the video content is changed, the type of the video content displayed on the electronic device, information about a correlation between the noise around the electronic device and the volume information about the electronic device when the video content is displayed, and facial information about the user when a volume of the electronic device is changed.

8. The method of claim 7, wherein the receiving comprises:
 receiving noise generated around the electronic device;
 receiving volume adjustment information about the electronic device when change information about the video content displayed on the electronic device is generated; and
 detecting the facial information about the user adjusting a volume of the electronic device.

9. The method of claim 8, wherein the receiving the noise comprises receiving the noise from a point of time at which the electronic is turned on, or receiving the noise when a variation in the volume of the electronic device is at least a preset threshold value.

10. The method of claim 8, wherein the detecting the facial information comprises storing the facial information of the user when the electronic device is turned on or when a volume adjustment operation of the electronic device is performed.

11. The method of claim 7, further comprising:
 determining, in response to detecting either turning on of the electronic device or changing of the video content, whether a viewer viewing the video content displayed on the electronic device is the user detected previously based on the facial information,
 wherein the determining comprises adjusting the volume of the electronic device to a volume suitable for the user predicted by the deep neural network model.

12. The method of claim 11, wherein the determining comprises detecting either turning on of the electronic device or changing of the video content, determining whether there are a plurality of viewers viewing the video content based on the facial information, and adjusting the volume of the electronic device to a volume suitable for a first viewer among the plurality of viewers when it is determined that there are the plurality of viewers,
 wherein the first viewer has a highest volume among suitable volumes predicted by the deep neural network model.

* * * * *